US012681114B2

(12) United States Patent
Krug et al.

(10) Patent No.: US 12,681,114 B2
(45) Date of Patent: Jul. 14, 2026

(54) GRADIENT COIL UNIT WITH SEPARATELY DRIVABLE CONDUCTOR PATTERN PAIRS

(71) Applicant: Siemens Healthineers AG, Forchheim (DE)

(72) Inventors: Andreas Krug, Erlangen (DE); Simon Bauer, Erlangen (DE); Stefan Stocker, Erlangen (DE); Peter Dietz, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 245 days.

(21) Appl. No.: 18/373,430

(22) Filed: Sep. 27, 2023

(65) Prior Publication Data

US 2024/0103108 A1 Mar. 28, 2024

(30) Foreign Application Priority Data

Sep. 27, 2022 (DE) ..................... 10 2022 210 218.5

(51) Int. Cl.
*G01R 33/385* (2006.01)

(52) U.S. Cl.
CPC ..... *G01R 33/3852* (2013.01); *G01R 33/3856* (2013.01)

(58) Field of Classification Search
CPC ........................ G01R 33/3852; G01R 33/3856
See application file for complete search history.

(56) References Cited

U.S. PATENT DOCUMENTS

| | | | |
|---|---|---|---|
| 4,794,338 A | 12/1988 | Roemer et al. | |
| 5,311,135 A | 5/1994 | Vavrek et al. | |
| 5,581,187 A | 12/1996 | Pausch | |
| 7,358,551 B2 * | 4/2008 | Chidambarrao ... | H10D 84/0133 |
| | | | 257/E29.085 |
| 7,489,131 B2 * | 2/2009 | Lvovsky ........... | G01R 33/3856 |
| | | | 324/307 |
| 9,927,507 B2 * | 3/2018 | Terada ................. | G01R 33/022 |
| 2007/0063705 A1 | 3/2007 | Ham | |
| 2011/0140695 A1 | 6/2011 | Hollis et al. | |
| 2014/0333306 A1 | 11/2014 | Ham | |
| 2015/0077118 A1 | 3/2015 | Shvartsman et al. | |
| 2016/0139221 A1 | 5/2016 | Overweg | |
| 2019/0033405 A1 | 1/2019 | Fath et al. | |
| 2019/0187229 A1 | 6/2019 | Overweg | |

FOREIGN PATENT DOCUMENTS

| | | |
|---|---|---|
| CN | 1115110 A | 1/1996 |
| CN | 1875288 A | 12/2006 |
| CN | 102713682 A | 10/2012 |

(Continued)

*Primary Examiner* — Gregory H Curran
(74) *Attorney, Agent, or Firm* — Banner & Witcoff, Ltd.

(57) ABSTRACT

The disclosure relates to a gradient coil unit comprising a hollow cylindrical primary coil longitudinally surrounding a cylinder axis and designed to generate a magnetic field gradient in a first spatial direction, which primary coil comprises two primary conductor pattern pairs. Each primary conductor pattern pair of the two primary conductor pattern pairs is separately drivable, spans one half of the primary coil in each case, and comprises two spiral conductor patterns, which are formed by an electrical conductor implemented as a hollow conductor.

20 Claims, 9 Drawing Sheets

(56)     References Cited

FOREIGN PATENT DOCUMENTS

| CN | 105308472 A | 2/2016 |
|---|---|---|
| CN | 109642932 A | 4/2019 |
| DE | 102010061197 A1 | 6/2011 |
| DE | 112012005359 T5 | 10/2014 |
| DE | 102017213026 A1 | 1/2019 |
| EP | 3561534 A1 | 10/2019 |
| JP | H08136070 A | 5/1996 |
| JP | H11316060 A | 11/1999 |
| JP | 2012047413 A | 3/2012 |

* cited by examiner

GRADIENT COIL UNIT WITH SEPARATELY DRIVABLE CONDUCTOR PATTERN PAIRS

CROSS-REFERENCE TO RELATED APPLICATIONS

The present application claims priority to and the benefit of Germany patent application no. DE 10 2022 210 218.5, filed on Sep. 27, 2022, the contents of which are incorporated herein by reference in their entirety.

TECHNICAL FIELD

The disclosure relates to a gradient coil unit comprising a primary coil with two separately drivable conductor pattern pairs, a gradient system, and a magnetic resonance apparatus.

BACKGROUND

In a magnetic resonance apparatus, the body of an object, e.g. a patient to be examined, is usually exposed to a relatively high main magnetic field of e.g. 1.5 or 3 Tesla by means of a main magnet. During magnetic resonance imaging (MRI), gradient pulses are played out using a gradient coil unit. In addition, radiofrequency (RF) pulses, e.g. excitation pulses, are then emitted via an RF antenna unit by means of suitable antenna equipment, causing the nuclear spins of particular atoms resonantly excited by these RF pulses to be tilted by a defined flip angle relative to the lines of force of the main magnetic field. As the nuclear spins relax, radiofrequency signals, so-called magnetic resonance signals, are emitted which are received by means of suitable RF antennas and then undergo additional processing. Finally, the desired image data can be reconstructed from the raw data acquired in this way.

For a particular measurement, a specific magnetic resonance (MR) control sequence, also called a pulse sequence, must therefore be emitted, the latter consisting of a sequence of RF pulses, e.g. excitation pulses and refocusing pulses, as well as gradient pulses to be emitted in a suitably coordinated manner in different gradient axes along different spatial directions. With appropriate timing, readout windows are set which specify the time periods in which the induced magnetic resonance signals are detected.

A gradient coil unit conventionally comprises three primary coils and three corresponding secondary coils. The three primary coils typically constitute a primary coil unit. The three secondary coils typically constitute a secondary coil unit. A primary coil is typically designed to generate a magnetic field gradient in a spatial direction, e.g. inside a patient tunnel. A magnetic field gradient is typically a first-order and/or a linear-order magnetic field, e.g. a magnetic field whose amplitude increases linearly along a spatial direction. Outside the patient tunnel the effect of a primary coil is largely suppressed by a secondary coil associated with the primary coil. The secondary coil typically surrounds the corresponding primary coil and is electrically connected in series thereto. The typically three primary coils making up the gradient coil unit are designed to generate magnetic field gradients in three mutually-perpendicular spatial directions.

A magnetic field gradient is generated by driving the primary coil with electric currents whose amplitudes attain several 100 A and which are subject to frequent and rapid changes in current direction with rise and fall rates of several 100 kA/s. A magnetic field gradient is thus a time-varying magnetic field.

Stronger magnetic field gradients and/or rise and fall rates typically allow larger gradient moments and therefore faster acquisition of raw data and/or higher image data resolution. Particularly in the case of diffusion-weighted imaging and/or when using a magnetic resonance apparatus having a main magnetic field of more than 3 Tesla, powerful magnetic field gradients of up to 250 mT/m with rise and fall rates of up to 150 T/s/m, cases up to 200 T/s/m, are desirable. Especially for whole-body examinations extending over a lengthy period of time and requiring that the size of the patient tunnel, e.g. the examination area, be designed such that not only the head area but also the abdomen of a patient can be positioned within the patient tunnel, such powerful gradient coil units are currently unknown.

SUMMARY

The object underlying the disclosure is to provide a gradient coil unit for generating a particularly high magnetic field gradient with high rise and fall rates. The object is achieved by the embodiments as discussed in further detail herein, including the features of the claims.

The gradient coil unit according to the disclosure comprises a hollow cylindrical primary coil longitudinally surrounding a cylinder axis and configured to generate a magnetic field gradient in a first spatial direction, said primary coil comprising two primary conductor pattern pairs, wherein each primary conductor pattern pair of the two primary conductor pattern pairs is separately drivable, spans in each case one half of the primary coil, e.g. two quadrants of the primary coil and/or of the gradient coil unit, and comprises two spiral conductor patterns. Each primary conductor pattern pair of the two primary conductor pattern pairs comprises an electrical conductor implemented as a hollow conductor and/or is constituted by an electrical conductor implemented as a hollow conductor.

The first spatial direction may be perpendicular to the longitudinal direction and corresponds to the x-direction or the y-direction. The gradient coil unit is typically in the form of a hollow cylinder longitudinally surrounding the cylinder axis. The gradient coil unit and/or the primary coil can typically be subdivided into four quadrants and/or the gradient coil unit comprises four quadrants, wherein said four quadrants typically define just four disjoint geometric regions of the gradient coil unit. The four quadrants typically denote regions of the gradient coil unit, wherein a transition between two quadrants is without physical and/or visible separation in each case. The gradient coil unit and/or the primary coil can typically be subdivided into two halves and/or the gradient coil unit comprises two halves, wherein these two halves typically define just two disjoint geometric regions of the gradient coil unit. The two halves typically denote regions of the gradient coil unit, wherein a transition between the two halves is without physical and/or visible separation in each case. The halves of the gradient coil unit are typically separated from each other by a plane parallel to the longitudinal direction, e.g. by a plane comprising the cylinder axis, or by a plane perpendicular to the longitudinal direction.

A primary conductor pattern pair typically comprises the electrical conductor having a defined geometric arrangement. A primary conductor pattern pair is typically disposed on a lateral surface of a cylinder and/or is saddle-shaped. The two primary conductor pattern pairs may be disposed on the same lateral surface of a cylinder and/or are saddle-shaped with the same curvature and/or are at the same radial distance from the cylinder axis. The two primary conductor pattern pairs may have different positions, possibly differing by e.g. 180°, in the circumferential direction of the cylinder, or in the longitudinal direction, wherein a primary conductor pattern pair completely circumferentially surrounds one half of the cylinder in the longitudinal direction. A primary conductor pattern pair is typically spatially bounded by and/or disposed within two quadrants of the gradient coil unit, wherein the two quadrants have at least one common edge and/or surface.

A spiral conductor pattern typically comprises a portion of the electrical conductor associated with the primary conductor pattern pair, said conductor having a defined geometric arrangement on a lateral surface of a cylinder within a quadrant. The spiral conductor pattern is typically saddle-shaped. The spiral conductor pattern may be at least partially spiral-shaped, having turns of different radius relative to a fixed point. The spiral conductor pattern surrounds at least one fixed point and/or eye at least partially in a spiral manner.

The spiral conductor patterns comprised by a primary conductor pattern pair are typically constituted by an electrical conductor, e.g. the same electrical conductor, which is shaped such that it consecutively forms a first spiral conductor pattern of the two spiral conductor patterns in a first quadrant and a second spiral conductor pattern of the two spiral conductor patterns in a second quadrant. Accordingly, when the primary conductor pattern pair is driven, an electric current is passed through the primary conductor pattern pair, e.g. by means of the electric conductor, wherein current first flows through a first spiral conductor pattern of the two spiral conductor patterns and then through a second spiral conductor pattern of the two spiral conductor patterns. Each primary conductor pattern pair is typically driven by a gradient amplifier unit.

The two primary conductor pattern pairs may be disposed symmetrically with respect to one another, e.g. symmetrically with respect to the cylinder axis and/or with respect to an axis perpendicular to the cylinder axis. Each of the two primary conductor pattern pairs may be constituted by a respective electrical conductor, e.g. a single electrical conductor, e.g. an electrical conductor implemented as a hollow conductor. The two spiral conductor patterns of a primary conductor pattern pair are e.g. mutually symmetrical.

The hollow conductor can be of monolithic design. The hollow conductor comprises an electrically conductive material which has a hollow region in the interior, which hollow region extends over the length of the hollow conductor. The electrically conductive material is configured to carry an electrical current according to the spiral conductor patterns. The hollow region is configured to hold a coolant, e.g. a fluid. A layer and/or coating comprising another material can be disposed between the hollow region and the electrically conductive material. The layer and/or coating can be implemented as a tube. The other material can be e.g. stainless steel.

The cross-sectional area of the hollow region can be circular and/or rectangular and/or elliptical. The cross-sectional area of the hollow conductor can have a rectangular and/or oval and/or circular shape on the side facing the hollow region, and/or can have beveled corners. The hollow conductor is typically configured to hold a fluid, or such that a coolant, e.g. a fluid, can flow inside the hollow region, e.g. along the length of the hollow conductor. The hollow conductor may allow a coolant to flow through it. The gradient coil unit can incorporate a cooling circuit comprising a coolant. The hollow conductor can be configured to accommodate the coolant. The cooling circuit can comprise a pump for generating a coolant flow, e.g. through the hollow conductor. The cooling circuit may comprise a cooling unit designed to lower the temperature of the coolant. The cooling unit and/or the pump is typically disposed outside the hollow cylindrical shape of the gradient coil unit.

The gradient coil unit is typically hollow cylindrical in shape. The gradient coil unit is typically configured such that the diameter of the inside of the primary coil is of any suitable dimensions, such as e.g. at least 55 cm, at least 60 cm, at least 70 cm, etc. The gradient coil unit is typically configured such that a patient, e.g. a patient's abdomen, can be disposed within a hollow area surrounded and/or enclosed by the gradient coil unit. The gradient coil unit can also be configured as a local head gradient coil, wherein a patient's head can be disposed within a hollow area surrounded and/or enclosed by the gradient coil unit. If the gradient coil unit is configured as a local head gradient coil, the diameter of the inside of the primary coil may be of any suitable dimensions, such as e.g. between 35 and 55 cm, between 40 and 50 cm, etc.

According to the disclosure, the gradient coil unit comprises two primary conductor pattern pairs and four spiral conductor patterns, wherein the four spiral conductor patterns are disposed in quadrants that are different from each other. The gradient coil unit may comprise an additional primary coil which is implemented similarly to the incorporated primary coil, but is rotated by 90° in the circumferential direction. This additional primary coil is configured to generate a magnetic field gradient in a third spatial direction that is perpendicular to the first spatial direction and perpendicular to the longitudinal direction.

It has been recognized that the amplitude of a magnetic field gradient (G) is proportional to a sensitivity (S) and current intensity (I) of the primary coil. In addition, the slew rate (SR), i.e. the maximum rise and fall rate, is given by: $SR=S \cdot dI/dt$. Moreover, taking into account the inductance (L) of the primary coil and the electrical resistance (R) of the primary coil, the voltage (U) is given by: $U=L \cdot dI/dt+R \cdot I$. The inductance typically dominates the resistance. Increasing the voltage (U) allows both the slew rate and the current, i.e. the magnetic field gradient, to be increased. The use of two separately drivable primary conductor pattern pairs allows for particularly high voltages to be used for driving the primary coil. Any resulting increase in power loss $P=I^2 \cdot R$ in the form of heat can be dissipated particularly well using hollow conductors. The same applies to the gradient coil comprising the primary coil.

Accordingly, the combination of hollow conductors with two separately drivable pairs of primary conductor patterns provides a particularly high magnetic field gradient amplitude with simultaneously high rise and fall rates. For instance, subdividing the primary coil into two primary conductor pattern pairs which may have the same diameter and/or radial distance from the cylinder axis, e.g. a single-layer design of the primary coil, provides in particular a compact design of the gradient coil unit. In addition, the use of hollow conductors obviates the need for cooling layers. Conventionally, the power loss of a gradient coil unit is dissipated by means of separate cooling layers which can be up to several centimeters away from the electrical conductor. The efficiency of the cooling and thus the time during which magnetic field gradients of particularly high amplitude can be generated is determined by the transfer from the heat source, i.e. the electrical conductor, to the coolant, and is therefore determined by contact resistance, thermal conductivity, and capacitance of the material, and by the coolant and the amount of energy that can be dissipated. Direct cooling using hollow conductors can minimize the transfer losses, especially by minimizing the contact resistance and thermal capacitance between the heat source and the coolant, and improve the efficiency of the cooling. With appropriate hollow conductor design, especially in terms of cross-section and length, direct cooling can quickly dissipate the power loss from the conductor. There is no inertia due to heating of the thermal capacitance between the electrical conductor and the coolant. The gradient coil unit according to the disclosure advantageously has no additional cooling layers. This allows a particularly large inner diameter of the gradient coil unit and thus a particularly large examination area which may e.g. completely surround and/or enclose a patient's upper body and/or head. For instance, when the gradient coil unit is implemented as a local head gradient coil configured to accommodate a head region of a patient, at least one primary conductor pattern pair of the two primary conductor pattern pairs can be of asymmetrical design. For example, the two spiral conductor patterns making up the conductor pattern pair can have a different spatial extent in the longitudinal direction.

One embodiment of the gradient coil unit provides that a portion of the electrical conductor of a primary conductor pattern pair, which is to be associated with a spiral conductor pattern of the two spiral conductor patterns, can be subdivided into two serially interconnected sections, e.g. into two electrically series-connected sections, and the portion of the electrical conductor is spirally arranged in turns such that two adjacent turns of the electrical conductor are to be associated with the two mutually different sections.

The electrical conductor is typically to be subdivided into two portions, wherein a first portion of the two portions forms a first spiral conductor pattern of the two spiral conductor patterns and a second portion of the two portions forms a second spiral conductor pattern of the two spiral conductor patterns. The two portions are typically serially connected to each other, e.g. electrically connected in series. According to this embodiment, each portion of the two portions is subdivided into two serially interconnected sections and/or can comprise the two sections. The two sections may merge continuously into one another at exactly one position, and are accordingly contiguous at this position. The length of the two sections may differ by less than any suitable dimension, such as e.g. 5%, 1%, etc. Accordingly, the two sections can be referred to as halves of a portion.

The geometrical arrangement of the electrical conductor may be such that it runs spirally in turns around at least one fixed point, e.g. on a saddle shape. The electrical conductor, e.g. the portion, is disposed such that a plurality of turns run on a connecting line between the fixed point and an edge of the quadrant, wherein the connecting line alternately crosses, at least partially, a turn associated with a first portion of the two portions and a turn associated with the second portion of the two portions. A turn is to be associated with the first section if the electrical conductor forming that turn corresponds to the first section of the portion of the electrical conductor. A turn is to be associated with the second section if the electrical conductor forming that turn corresponds to the second section of the portion of the electrical conductor.

The turns may be disposed such that when the primary coil is driven, e.g. when the primary conductor patterns pair is driven, an electric current is oriented identically and/or in parallel in two adjacent turns.

This arrangement of the electrical conductor according to this embodiment allows a coolant enclosed by the hollow conductor to distribute more uniformly across the different turns. For example, adjacent turns following the spiral arrangement have a spacing of the length of a section. The coolant typically heats up along the spiral arrangement and flows first through the first section and then through the second section, for which reason the cooling capacity of the coolant is greater in the first section than in the second section. According to this embodiment, the primary coil can be cooled particularly well because the coolant can distribute and act uniformly within the hollow conductor.

The sensitivity of a gradient coil unit is typically determined by the current density, e.g. by a spatial density of the electrical conductor, e.g. the spiral conductor pattern. A higher number of turns typically results in a smaller distance between two adjacent turns, which typically results in an increase in the current density for driving the primary coil.

Because of its arrangement, the gradient coil unit according to this embodiment can have a higher conductor density compared to a conventional gradient coil unit, thereby producing a higher amplitude of the magnetic field gradient. A higher conductor density can increase the inductance L, and a longer electrical conductor can increase the resistance R and thus the power dissipation P. The improved cooling due to the arrangement of the turns and the use of the hollow conductor can dissipate heat due to power particularly well. Subdividing the primary coil into two primary conductor pattern pairs makes it possible to use higher voltages and thus compensate for the higher inductance. Accordingly, this embodiment provides particularly strong magnetic field gradients with a simultaneously high slew rate.

One embodiment of the gradient coil unit comprises a first cooling circuit having a first coolant and a second cooling circuit having a second coolant, wherein the electrical conductor in a first section of the two serially interconnected sections encloses the first coolant as a hollow conductor and the electrical conductor in a second section of the two serially interconnected sections encloses the second coolant as a hollow conductor.

According to this embodiment, the gradient coil unit is configured such that two cooling circuits are associated with a spiral conductor pattern. According to this embodiment, the first cooling circuit is configured to cool the first section. According to this embodiment, the first cooling circuit is configured to cause the first coolant to flow through the first section, e.g. the hollow region of the hollow conductor of the first section. According to this embodiment, the second cooling circuit is configured to cause the second coolant to flow through the second section, e.g. the hollow region of the hollow conductor of the second section.

Each cooling circuit disclosed in this description, e.g. also the first, the second, and each cooling circuit described or claimed elsewhere in the following description, can comprise a pump for generating a flow and/or passage of the corresponding coolant, e.g. through a hollow conductor. Each cooling circuit may comprise a cooling unit configured to lower the temperature of the coolant. The cooling unit and/or pump is typically disposed outside the hollow cylindrical shape of the gradient coil unit.

The first cooling circuit and the second cooling circuit may be separate from each other. The first coolant and the second coolant may consist of a fluid. The first coolant and the second coolant typically have the same chemical and/or physical properties and/or comprise the same material. The first coolant and the second coolant typically differ only in that they are associated with different cooling circuits in each case. The first coolant can be the same as the second coolant.

Coolant can flow in parallel through the first cooling circuit and the second cooling circuit and/or the cooling circuits can be supplied from the same reservoir comprising the first coolant and the second coolant and/or the first coolant and the second coolant can be jointly caused to flow by a pump, and/or the first coolant and the second coolant can be cooled by a common and/or single cooling unit.

Accordingly, this embodiment of the gradient coil unit provides that the temperature of a respective spiral conductor pattern can be regulated by two cooling circuits and/or the power loss of a spiral conductor pattern can be dissipated by means of two cooling circuits. When the two cooling circuits are used, the length of each cooling circuit may be reduced and/or halved compared to cooling with only one cooling circuit, thereby enabling the efficiency of the cooling to be improved. The lengths of the first cooling circuit and second cooling circuit typically differ by any suitable dimension, such as less than 5%, less than 1%, etc.

Accordingly, this embodiment of the gradient coil unit provides that a spiral conductor pattern is cooled by two cooling circuits in each case, a primary conductor pattern pair is cooled by four cooling circuits in each case, and the primary coil as a whole is cooled by at least eight cooling circuits.

This embodiment improves the cooling performance of the gradient coil unit. For instance, the use of hollow conductors within whose hollow region a coolant flows provides particularly efficient heat dissipation, especially compared to cooling layers. The additional use of a plurality of cooling circuits allows effective cooling, since increasing the number of cooling circuits enables the length of the individual cooling circuits to be reduced, thus reducing the average temperature of the cooling media. For example, this also enables continuous generation of magnetic field gradients of above-average amplitude, e.g. of at least 35 mT/m over a period of at least half an hour, i.e. a typically maximum duration of an MRI examination of a patient.

It has been recognized that the amplitude of a magnetic field gradient (G) is proportional to the current density, to which current density the sensitivity (S) of the gradient coil unit is proportional. Increasing the number of conductors, particularly the number of turns, typically increases the current density. If the number of turns is doubled using an electrical conductor of half the thickness, the sensitivity (S) is typically doubled and the electrical resistance (R) quadruples. The inductance (L) typically quadruples, which means that, without additional action, the slew rate (SR) is halved according to $U=L \, dI/dt+RI$ and $SR=U/L \cdot S$, where the resistive component is negligible compared to the inductive component. The slew rate can be kept constant by doubling the voltage e.g. by using two separately drivable primary conductor pattern pairs according to the disclosure. According to this example, the power loss $P=I^2 \cdot R=(G/S)^2$. R dissipated as heat remains unchanged unless a higher amplitude of the magnetic field gradient (G) is generated.

Since the higher sensitivity (S) typically enables a higher amplitude of the magnetic field gradient (G), the power loss dissipated as heat also increases with it, and there is an increased cooling requirement. For example, the generation of high gradient moments combined with the possibility of fast switching of the gradient coil unit, i.e. a high slew rate, requires new cooling options.

The use of hollow conductors in conjunction with a plurality of cooling circuits according to this embodiment provides efficient cooling and dissipation of power loss over an extended period of time. This embodiment enables a maximum magnetic field gradient amplitude of any suitable value, such as e.g. at least 180 mT/m, at least 200 mT/m, and to be generated at any suitable slew rate such as e.g. at least 180 mT/m/ms, at least 200 mT/m/ms, such as when the two gradient amplifier units are each driven with a voltage of between 2200 V and 2300 V and/or with a current of between 1100 and 1300 A. The ohmic resistance of the primary coil and/or the gradient coil unit can be e.g. between 400 m$\Omega$ and 500 m$\Omega$, and the inductance between e.g. 1350 $\mu$H and 3500 $\mu$H, between 2000 $\mu$H and 3000 $\mu$H, etc.

One embodiment of the gradient coil unit provides that the portion of the electrical conductor is disposed in such a way that the two adjacent turns each run in pairs and/or one turn in each case has a smaller distance from a first adjacent turn than from a second adjacent turn. This embodiment provides particularly uniform cooling of the primary coil. In addition, such a gradient coil unit is particularly durable to manufacture.

One embodiment of the gradient coil unit provides that the electrical conductor is disposed spirally in turns such that each of the two spiral conductor patterns has at least 35 turns.

According to this embodiment, the electrical conductor is configured such that it surrounds at least one fixed point within a quadrant in any suitable number of turns, such as e.g. at least 35 turns, at least 39 turns, at least 45 turns, etc., at least partially in a spiral manner. The turns can be assigned to the first section or the second section. The electrical conductor typically has less than 65, less than 55, less than 50 turns, etc., within a quadrant.

Such a high number of turns per unit area provides a particularly high current density and thus a particularly high maximum gradient amplitude.

One embodiment of the gradient coil unit provides that the electrical conductor has a cross-sectional area of any suitable size, such as e.g. less than 35 mm$^2$, less than 32 mm$^2$, less than 30 mm$^2$, etc. The cross-sectional area of the electrical conductor typically includes the cross-sectional area of the conductive material of the electrical conductor, e.g. the hollow conductor. The cross-sectional area of the hollow region of the electrical conductor, e.g. of the hollow conductor, which hollow region can be configured to hold a coolant, is typically between any suitable range of dimensions such as e.g. 9 mm$^2$ and 16 mm$^2$, between 11 mm$^2$ and 14 mm$^2$, between 12 mm$^2$ and 13 mm$^2$, etc. A hollow conductor configured in this way can conduct an electric current with a strength of between 800 A and 1500 A, between 800 A and 1200 A, etc., particularly well with the lowest possible power loss while at the same time providing direct cooling by means of the coolant.

One embodiment of the gradient coil unit provides that each of the spiral conductor patterns is configured such that it spirally surrounds two fixed points, e.g. within a quadrant. The two fixed points may be at different positions in the longitudinal direction. A first fixed point of the two fixed points is typically closer to a center of the gradient coil unit in the longitudinal direction than a second fixed point of the two fixed points. The first fixed point and the second fixed point may be at the same position in the circumferential direction. The number of turns of the electrical conductor surrounding the first fixed point is typically at least three times, at least five times, etc., the number of turns of the electrical conductor surrounding the second fixed point. The spiral conductor pattern may be configured such that the turns surrounding the second fixed point run counter to the turns surrounding the first fixed point and/or an electric current in turns surrounding the first fixed point flows counter to an electric current in turns surrounding the second fixed point. This embodiment enables the force acting on the gradient coil unit to be reduced. In addition, any leakage field generated by the primary coil and/or gradient coil unit is reduced.

According to one embodiment of the gradient coil unit, the two primary conductor pattern pairs are separated from each other by a plane perpendicular to the cylinder axis. The two primary conductor pattern pairs may be symmetrical with respect to a plane perpendicular to the cylinder axis, e.g. the center plane of the gradient coil unit in the longitudinal direction. According to this embodiment, a primary conductor pattern pair spans half the length of the gradient coil unit in a fully circumferential manner. This embodiment can be durably manufactured and effectively enables the two primary conductor pattern pairs to be driven separately.

One embodiment of the gradient coil unit comprises an additional primary coil configured to generate a magnetic field gradient in a second spatial direction corresponding to the longitudinal direction, wherein the additional primary coil comprises two helical conductor patterns surrounding the cylinder axis, which two helical conductor patterns are spatially separated from each other by a plane perpendicular to the cylinder axis and are separately drivable, and each of the two helical conductor patterns comprises an additional electrical conductor implemented as a hollow conductor.

Each of the two helical conductor patterns may comprise one additional electrical conductor and/or is disposed within two quadrants having a common edge. A first helical conductor pattern of the two helical conductor patterns may be disposed within the same quadrants as the first primary conductor pattern pair. A second helical conductor pattern of the two helical conductor patterns may be disposed within the same quadrants as the second primary conductor pattern pair.

The helical conductor patterns are each disposed on a lateral surface of a cylinder and/or helically surround said cylinder. The two helical conductor patterns typically have the same diameter and/or are disposed coaxially with the primary coil and/or the cylinder axis.

This embodiment, the additional primary coil allows a magnetic field gradient to be generated in the longitudinal direction with the same specifications, e.g. the same amplitude and slew rate as the primary coil in the first spatial direction. Accordingly, this embodiment of the gradient coil unit is universally usable.

One embodiment of the gradient coil unit provides that the additional electrical conductor of a helical conductor pattern of the two helical conductor patterns can be divided into at least two serially interconnected additional sections, and the additional electrical conductor is disposed helically in additional turns in such a way that two adjacent additional turns of the additional electrical conductor are assignable to the at least two mutually different additional sections.

The two additional sections may merge continuously into one another at exactly one position, and are accordingly contiguous at this position. The length of the two additional sections may differ by less than 5%, less than 1%, etc. The additional turns may be disposed in such a way that, when the additional primary coil is driven, e.g. when the helical conductor pattern is driven, an electric current in two adjacent additional turns is aligned identically and/or in parallel. The two additional sections may be at the same radial distance from the cylinder axis and/or are longitudinally adjacent and/or disposed in parallel. The two additional sections can also be disposed adjacent to each other in the radial direction.

By virtue of its arrangement, the gradient coil unit according to this embodiment can have a higher conductor density compared to a conventional gradient coil unit and can therefore generate a higher magnetic field gradient amplitude in the longitudinal direction while maintaining a high slew rate. The improved cooling due to the arrangement of the additional windings and the use of the hollow conductor can remove heat generated due to power loss particularly effectively.

One embodiment of the gradient coil unit comprises a fourth cooling circuit having a fourth coolant and a fifth cooling circuit having a fifth coolant, wherein the electrical conductor in a first additional section of the two serially interconnected additional sections encloses the fourth coolant as a hollow conductor, and the electrical conductor in a second additional section of the two serially interconnected additional sections encloses the fifth coolant as a hollow conductor.

Due to the improved cooling, this embodiment, similarly to the embodiment of the gradient coil unit comprising the first cooling circuit and the second cooling circuit for the primary coil, allows a high-amplitude magnetic field gradient to be used in the second spatial direction, e.g. at least 35 mT/m, over a period of at least 30 minutes.

It is also conceivable for the electrical conductor of a helical conductor pattern to be subdivided into at least four serially interconnected additional sections, and for the additional electrical conductor to be disposed helically in additional turns such that four adjacent additional turns of the additional electrical conductor are assignable to the at least four mutually different additional sections. In this case, the gradient coil unit may comprise two additional cooling circuits in addition to the fourth cooling circuit and fifth cooling circuit, so that each section of the hollow conductor is cooled by a different one of the four cooling circuits, e.g. has the corresponding coolants flowing through it. This enables eight cooling circuits to be connected to the additional primary coil, thereby ensuring that it can be cooled with an effectiveness comparable to that of the primary coil.

One embodiment of the gradient coil unit comprises a secondary coil configured to shield the magnetic field gradient generated by the primary coil in a periphery of the gradient coil unit comprising two secondary conductor pattern pairs, wherein one of each of the two secondary conductor pattern pairs is disposed in the same half as one of the two primary conductor pattern pairs and is connected in series with said primary conductor pattern pair, and comprises a spirally arranged electrical conductor.

The spirally arranged electrical conductor of a secondary conductor pattern pair typically corresponds to the electrical conductor of the corresponding primary conductor pattern pair. The half typically comprises two quadrants. The spirally arranged electrical conductor of a secondary conductor pattern pair typically spirally surrounds at least partially a fixed point within each quadrant of the two quadrants. Each secondary conductor pattern pair of the two secondary conductor pattern pairs may comprise two secondary spiral conductor patterns, wherein one secondary spiral conductor pattern is disposed within each quadrant. The spirally arranged electrical conductor of a secondary conductor pattern pair can be a hollow conductor or a solid conductor. The secondary coil is typically farther from the cylinder axis than the primary coil.

In one embodiment of the gradient coil unit, the secondary conductor pattern pair has less than 60% of the turns of the primary conductor pattern pair. The secondary coil is typically more loosely wound and/or turns of the secondary conductor pattern pair are spaced farther apart than turns of a spiral conductor pattern of a primary conductor pattern pair. This provides efficient shielding while minimizing material usage.

One embodiment of the gradient coil unit comprises a third cooling circuit having a third coolant, wherein the electrical conductor comprised by a secondary conductor pattern pair is implemented as a hollow conductor enclosing the third coolant. According to this embodiment, the secondary coil may be cooled by at least two different cooling circuits. The gradient coil unit may comprise an eighth cooling circuit having an eighth coolant. The third cooling circuit and the eighth cooling circuit may be jointly configured to cool a secondary conductor pattern pair. For instance, the third cooling circuit can be configured to cool a portion of the secondary conductor pattern pair disposed in a first quadrant of the half. The eighth cooling circuit can be configured to cool a portion of the secondary conductor pattern pair disposed in a second quadrant of the half. In addition, the cooling is provided directly by causing the third coolant and the eighth coolant to flow through the hollow conductor. This ensures efficient cooling of the secondary conductor pattern pair and thus of the secondary coil.

In addition, the disclosure proceeds from a gradient system comprising a gradient coil unit according to the disclosure and at least two gradient amplifier units, wherein one of the two gradient amplifier units is connected to one of the two primary conductor pattern pairs in each case.

A gradient amplifier unit connected to a primary conductor pattern pair is configured to generate a defined electrical voltage and/or a defined electrical current in the primary conductor pattern pair, typically as specified by a gradient control unit and/or an MR control sequence. The two gradient amplifier units connected to two primary conductor pattern pairs which are to be assigned to a primary coil, e.g. are incorporated in a primary coil, are typically controlled synchronously and/or simultaneously and/or with the same amplitude. The electrical currents and/or electrical voltages generated by these two gradient amplifier units typically differ by less than any suitable value, e.g. less than 1%, by less than 0.5%, etc., e.g. at any point in time when an MR control sequence is played out.

The gradient system may comprise four gradient amplifier units and two additional gradient amplifier units, e.g. a total of six gradient amplifier units. The gradient coil unit may comprise two primary coils and one additional primary coil, e.g. four primary conductor pattern pairs and two helical conductor patterns. One primary conductor pattern pair of each of the four primary conductor pattern pairs can typically be driven by one of the four gradient amplifier units in each case. One helical conductor pattern of the two helical conductor patterns is typically drivable by one of the two additional gradient amplifier units in each case.

Each of the two primary coils and the additional primary coil are configured to generate a magnetic field gradient in one spatial direction in each case, wherein the three spatial directions are different from one another, e.g. orthogonal to one another.

Due to the large number of gradient amplifier units and the special circuitry, a gradient system of this type is configured to generate particularly high electrical voltages in the individual primary conductor pattern pairs and/or helical conductor patterns. This provides particularly high magnetic field gradient amplitudes, especially in the first direction, while ensuring high rise and fall rates despite a high primary coil inductance.

The disclosure also proceeds from a magnetic resonance apparatus comprising a main magnet, a radiofrequency antenna unit, a gradient system according to the disclosure, and a gradient control unit connected to the gradient system and configured to cause the gradient system to generate a magnetic field gradient in the first spatial direction. The gradient control unit is configured to forward information according to an MR control sequence, e.g. gradient pulses, to the gradient amplifier units comprised by the gradient system.

Embodiments of the magnetic resonance device according to the disclosure and of the gradient system according to the disclosure are analogous to embodiments of the gradient coil unit according to the disclosure. The advantages of the magnetic resonance apparatus according to the disclosure and of the gradient system according to the disclosure essentially correspond to the advantages of the gradient coil unit according to the disclosure which are set out in detail above. Features, advantages, or alternative embodiments mentioned herein can likewise be applied to the other claimed subject matters, and vice versa.

BRIEF DESCRIPTION OF THE DRAWINGS

Further advantages, features, and details of the disclosure will emerge from the exemplary embodiments described below and from the associated drawings in which.

DETAILED DESCRIPTION OF THE DISCLOSURE

Figure 1:
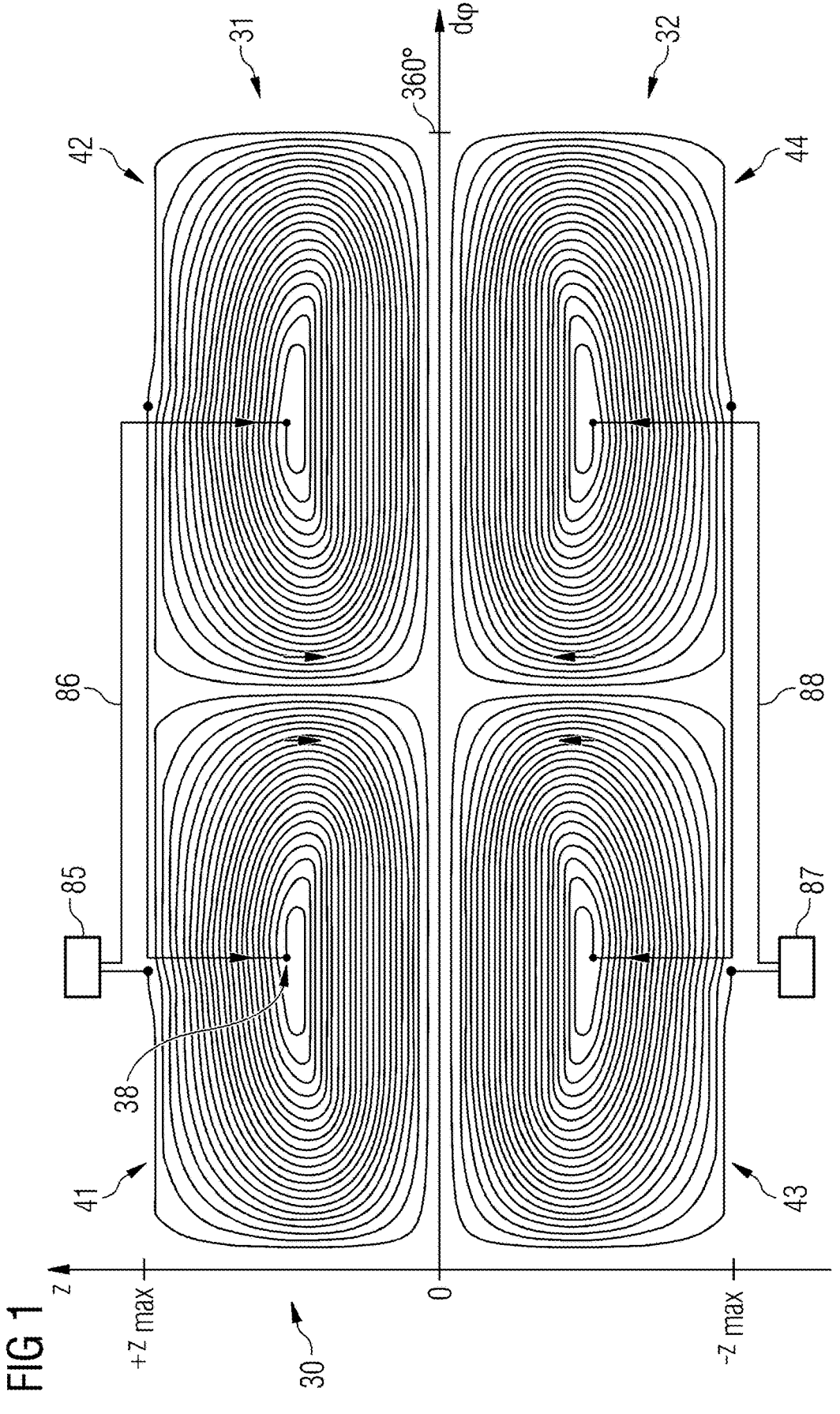
FIG. 1 illustrates a first embodiment of an example primary coil of a gradient coil unit according to the disclosure.

FIG. 1 illustrates a first embodiment of a primary coil 30 of a gradient coil unit 19 according to the disclosure. The primary coil 30 which surrounds a cylinder axis in a hollow cylindrical manner in the longitudinal direction z is shown here in unrolled form in the circumferential direction dφ.

The primary coil 30 comprises two primary conductor pattern pairs 31, 32. Each primary conductor pattern pair 31, 32 can be driven separately. For this purpose, each primary conductor pattern pair 31, 32 is connected to a respective gradient amplifier unit 85, 87. Said gradient amplifier unit 85, 87 is incorporated in the gradient system comprising the gradient coil unit 19 and/or may not be implemented as part of the gradient coil unit 19. Each primary conductor pattern pair 31, 32 spans two quadrants of the primary coil 30 in each case. A quadrant of the primary coil 30 is typically defined by z=[0; +/−zmax] and dφ=[0; +/−180°]. +/−zmax typically defines a respective longitudinal end of the gradient coil unit 19 in the longitudinal direction z. In addition, each primary conductor pattern pair 31, 32 comprises two spiral conductor patterns 41, 42, 43, 44, wherein one of the two spiral conductor patterns 41, 42, 43, 44 is disposed in one of the two quadrants in each case. Each spiral conductor pattern 41, 42, 43, 44 is thus limited to one quadrant.

For example, the first primary conductor pattern pair 31 of the two primary conductor pattern pairs 31, 32 can comprise the two spiral conductor patterns 41, 42, wherein a first conductor pattern 41 of the two spiral conductor patterns 41, 42 can be disposed in the quadrant defined by z=[0; +zmax] and dφ=[0; +180°] and a second conductor pattern 42 of the two spiral conductor patterns 41, 42 can be disposed in the quadrant defined by z=[0; +zmax] and dφ=[+180°; 360°]. Each primary conductor pattern pair 31, 32 comprises an electrical conductor 86, 88 implemented as a hollow conductor 80 and/or is a defined geometrical arrangement of the corresponding electrical conductor 86, 88. A spiral conductor pattern 41, 42, 43, 44 typically surrounds at least one first fixed point 38 at least partially in a spiral shaped manner in each case, which is shown only for the first conductor pattern 41 of the spiral conductor patterns 41, 42, 43, 44 in FIG. 1.

The primary coil 30 is configured to generate a magnetic field gradient in a first spatial direction, e.g. in the x-direction or in the y-direction. For example, the two primary conductor pattern pairs 31, 32 may be jointly configured to generate the magnetic field gradient in the first spatial direction. The arrows marked on the conductor patterns 41, 42, 43, 44 indicate a direction of current flow for generating a magnetic field gradient in the first spatial direction. In the embodiment shown, the two pairs of primary conductor patterns are separated from each other by a plane perpendicular to the cylinder axis, i.e. by a plane perpendicular to the longitudinal direction z at z=0.

Figure 2:
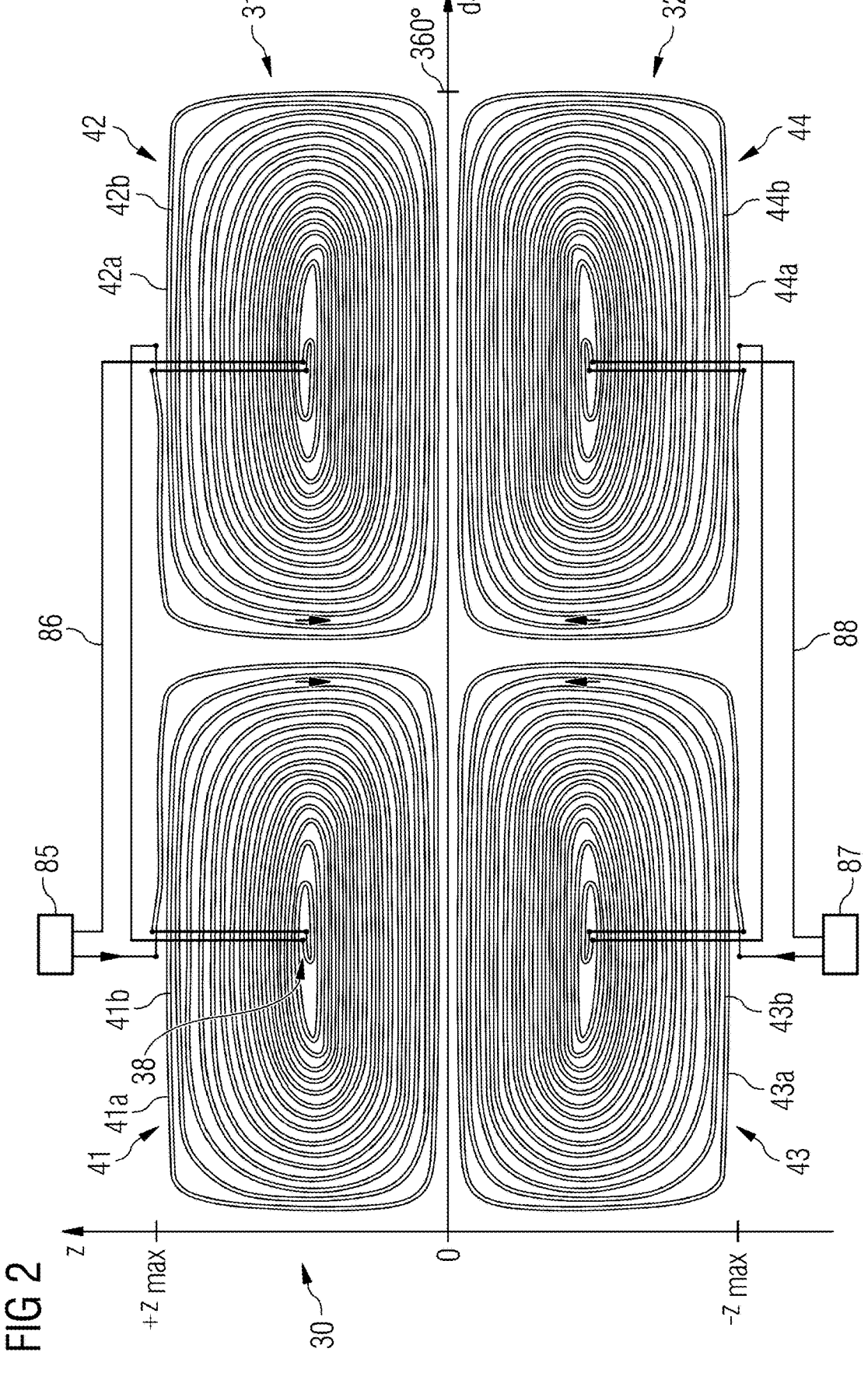
FIG. 2 illustrates a second embodiment of an example primary coil of a gradient coil unit according to the disclosure.

FIG. 2 illustrates a second embodiment of an example primary coil of a gradient coil unit according to the disclosure. The second embodiment differs from the first embodiment shown in FIG. 1 in that a portion of the electrical conductor 86, 88 of a primary conductor pattern pair 31, 32, which is to be assigned to a spiral conductor pattern of the two spiral conductor patterns 41, 42, 43, 44, can be divided into two serially interconnected sections 41a, 41b, 42a, 42b, 43a, 43b, 44a, 44b. Here, the portion of the electrical conductor 86, 88 is disposed spirally in turns in such a way that two adjacent turns of the electrical conductor 86, 88 can be assigned to the two mutually different sections 41a, 41b, 42a, 42b, 43a, 43b, 44a, 44b.

A first primary conductor pattern pair 31 of the two primary conductor pattern pairs 31, 32 comprises the two conductor patterns 41, 42. Each of the two conductor patterns 41, 42 comprises two serially connected sections 41a, 41b, 42a, 42b of the electrical conductor 86, wherein a first conductor pattern 41 of the two conductor patterns 41, 42 comprises the two connected sections 41a, 41b of the electrical conductor 86. The two sections 41a, 41b of the electrical conductor 86 are disposed spirally in turns surrounding the first fixed point 38 in such a way that two adjacent turns can be associated with the different sections 41a, 41b in each case.

The turns and/or the two sections 41a, 41b of the portion of the electrical conductor 86 may be arranged such that the two adjacent turns run in pairs and one turn of a first section 41a is at a lesser distance from a first adjacent turn 41b than from a second adjacent turn 41b in each case. The electrical conductor 86, 88 may be disposed spirally in turns such that each spiral conductor pattern 41, 42, 43, 44 has at least 35 turns.

Figure 3:
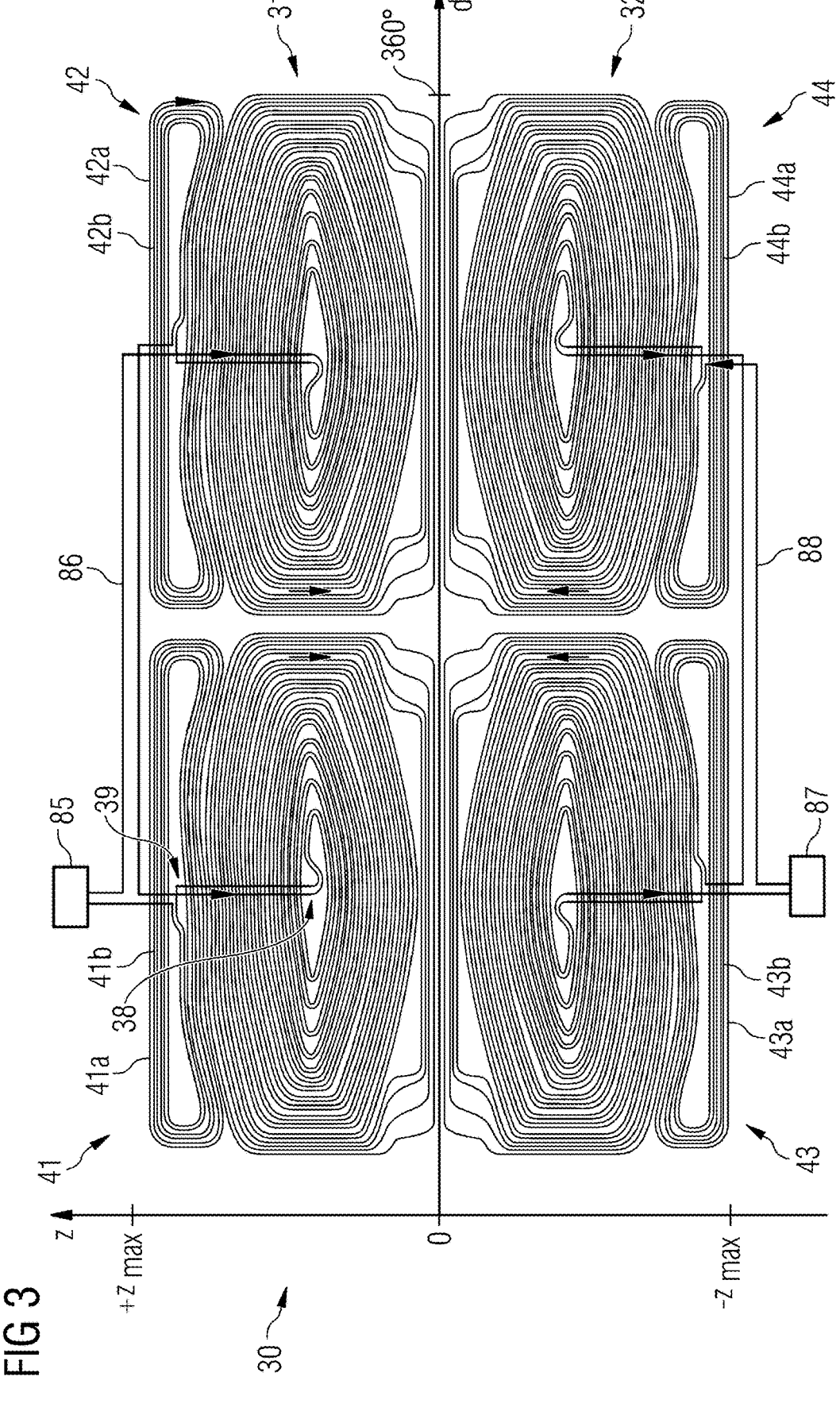
FIG. 3 illustrates a third embodiment of an example primary coil of a gradient coil unit according to the disclosure.

FIG. 3 illustrates a third embodiment of an example primary coil of a gradient coil unit according to the disclosure. The third embodiment differs from the second embodiment shown in FIG. 2 in that each of the spiral conductor patterns 41, 42, 43, 44 is configured such that it spirally surrounds two eyes 38, 39. The two eyes 38, 39 may differ in the longitudinal direction z and/or are disposed within a quadrant.

Figure 4:
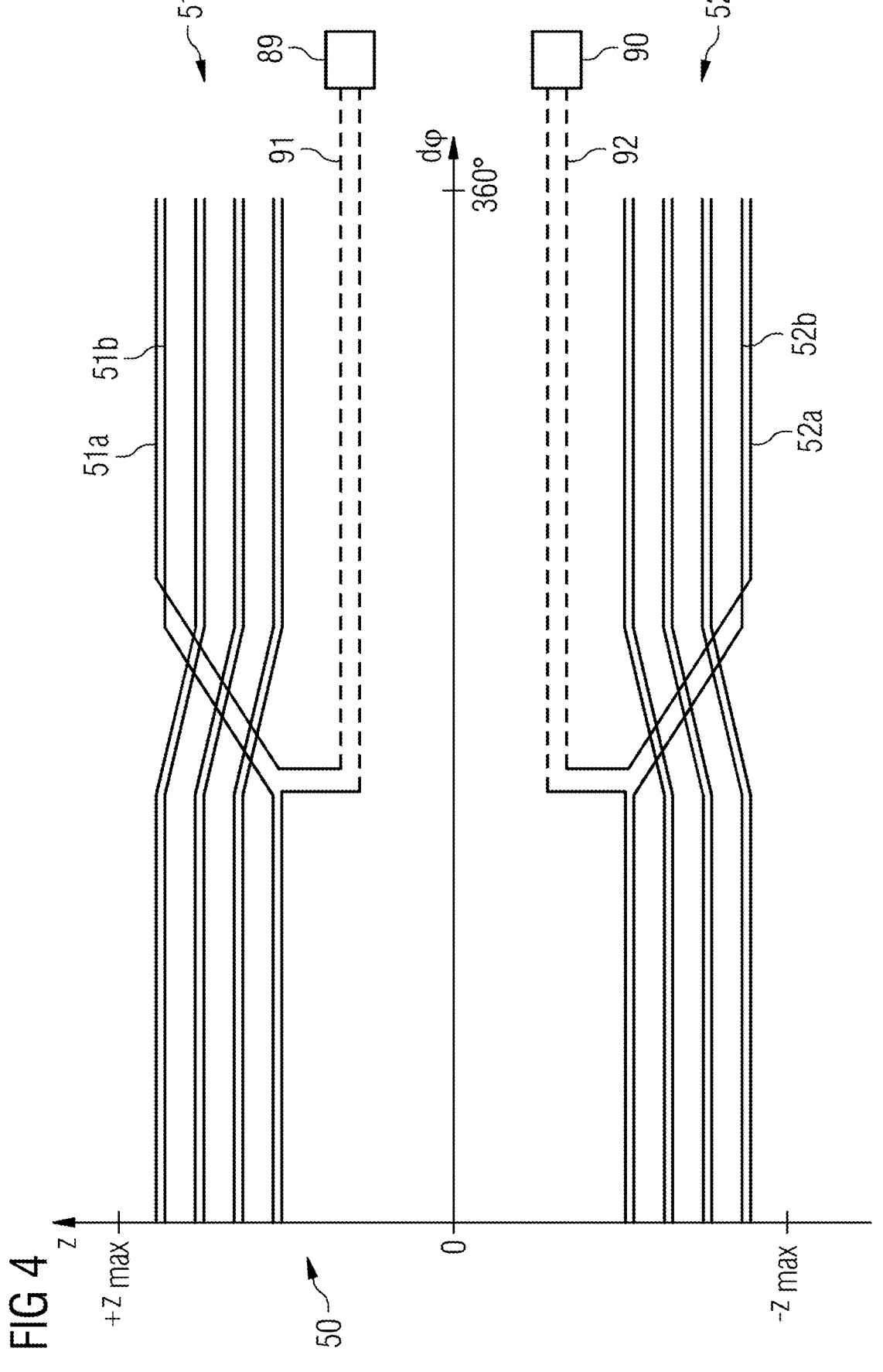
FIG. 4 illustrates an embodiment of an example additional primary coil of a gradient coil unit according to the disclosure.

FIG. 4 illustrates an embodiment of an additional primary coil 50. The additional primary coil 50 is configured to generate a magnetic field gradient in a second spatial direction corresponding to the longitudinal direction z. The additional primary coil 50 comprises two helical conductor patterns 51, 52 surrounding the cylinder axis. The two helical conductor patterns 51, 52 are spatially separated from each other by a plane perpendicular to the cylinder axis, e.g. perpendicular to the longitudinal direction z at z=0.

Each of the two helical conductor patterns 51, 52 comprises an additional electrical conductor 91, 92 implemented as a hollow conductor 80. Each of the two helical conductor patterns 51, 52 can be driven separately. For this purpose, a helical conductor pattern 51, 52 is connected to a respective additional gradient amplifier unit 89, 90, typically by the additional electrical conductor 91, 92. Said additional gradient amplifier unit 89, 90 is incorporated in the gradient system comprising the gradient coil unit 19 and/or may not be implemented as part of the gradient coil unit 19.

Each additional electrical conductor 91, 92 of a helical conductor pattern 51, 52 can be subdivided into at least two serially interconnected additional sections 51a, 51b, 52a, 52b. The additional electrical conductor 91, 92 is arranged helically in additional turns such that two adjacent additional turns of the additional electrical conductor 91, 92 are to be assigned to the at least two mutually different additional sections 51a, 51b, 52a, 52b.

Figure 5:
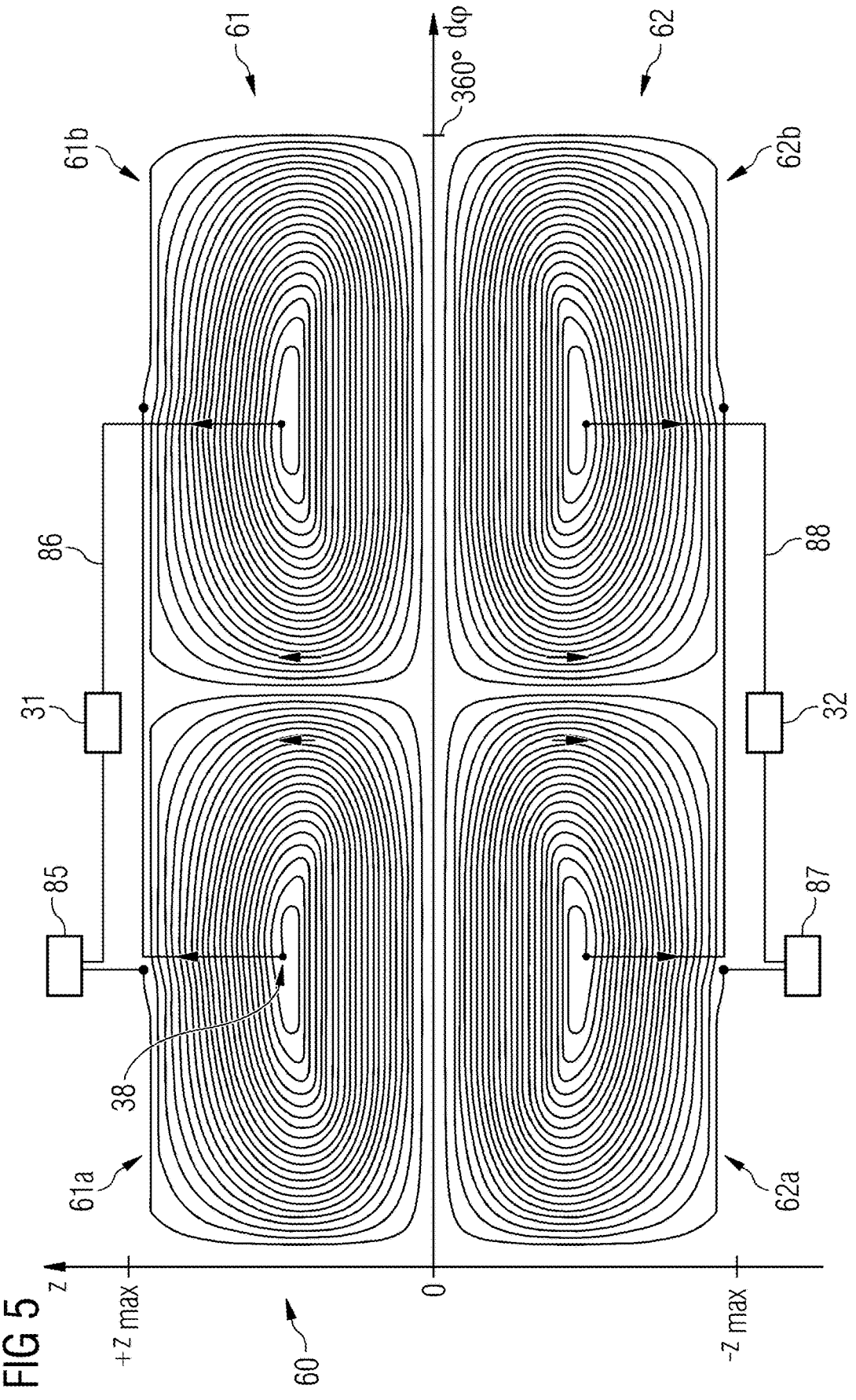
FIG. 5 illustrates a first embodiment of an example secondary coil of a gradient coil unit according to the disclosure.

FIG. 5 illustrates a first embodiment of a secondary coil 60 of a gradient coil unit according to the disclosure. The secondary coil 60 is configured to shield the magnetic field gradient generated by the primary coil 30 at a periphery of the gradient coil unit 19. The secondary coil 60 comprises two secondary conductor pattern pairs 61, 62, wherein one of the two secondary conductor pattern pairs 61, 62 is disposed in the two same quadrants in each case, e.g. in the same half of the gradient coil unit as one of the two primary conductor pattern pairs 31, 32, and is connected in series therewith. This can mean that a secondary conductor pattern pair 61, 62 is formed by the same electrical conductor 86, 88 as a primary conductor pattern pair 31, 32 connected in series with the corresponding secondary conductor pattern pair 61, 62. Each secondary conductor pattern pair 61, 62 may comprise two secondary spiral conductor patterns 61a,

61*b*, 62*a*, 62*b* which are disposed in mutually different quadrants in each case. The primary conductor pattern pairs 31, 32 and the gradient amplifier units 85, 87 are typically not part of the secondary coil 60 and are shown schematically in FIG. 5 to visualize the interconnection.

In addition, each of the two secondary conductor pattern pairs 61, 62 comprises an at least partially spirally arranged electrical conductor 86, 88. The electrical conductor 86, 88 of a secondary conductor pattern pair 61, 62 is in each case may be configured such that it at least partially spirally surrounds at least one fixed point 38 within a quadrant. A secondary conductor pattern pair 61, 62 has less than 60% of the turns of the corresponding primary conductor pattern pair 31, 32.

Figure 6:
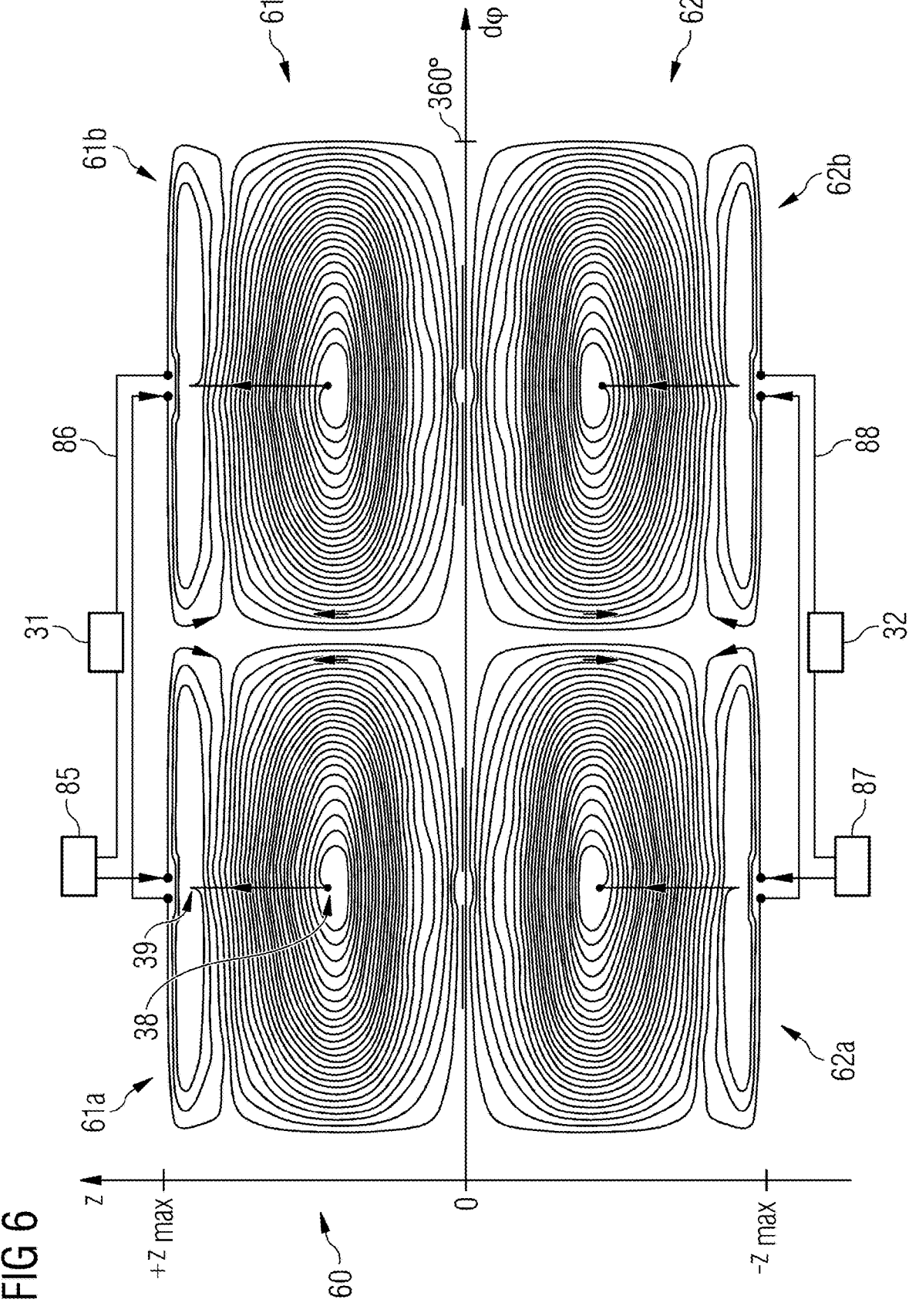
FIG. 6 illustrates a second embodiment of an example secondary coil of a gradient coil unit according to the disclosure.

FIG. 6 illustrates a second embodiment of a secondary coil 60 of a gradient coil unit according to the disclosure. This second embodiment differs from the first embodiment shown in FIG. 5 in that the electrical conductor 86, 88 of a secondary conductor pattern pair 61, 62 surrounds at least two fixed points 38, 39 at least partially in a spiral manner within a quadrant. The number of fixed points 38, 39 surrounded by a secondary conductor pattern pair 61, 62 within a quadrant may correspond to the number of fixed points 38, 39 surrounded by a spiral conductor pattern 41, 42, 43, 44 within a quadrant. The number of fixed points 38, 39 surrounded at least partially in a spiral manner by a primary conductor pattern pair 31, 32 may correspond to the number of fixed points 38, 39 surrounded at least partially in a spiral manner by a secondary conductor pattern pair 61, 62.

Figure 7:
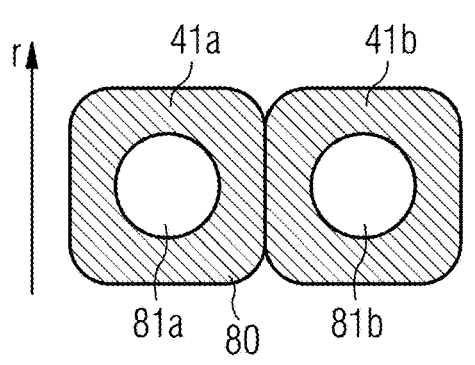
FIG. 7 illustrates a first embodiment of an example electrical conductor of a primary conductor pattern pair, said conductor being implemented as a hollow conductor.

FIG. 7 illustrates a first embodiment of an electrical conductor 86, 88, implemented as a hollow conductor 80, of a primary conductor pattern pair 31, 32, which hollow conductor 80 encloses a coolant 81, in a view representing a cross-section, e.g. the cross-sectional area, of the electrical conductor 86, 88. The additional electrical conductor 91, 92 can be implemented analogously to the electrical conductor 86, 88 shown in FIG. 7.

Figure 8:
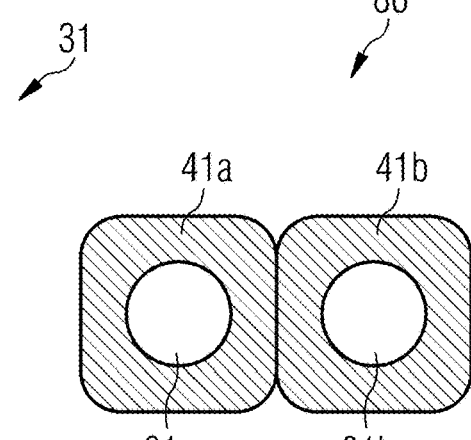
FIG. 8 illustrates a first embodiment of an example arrangement of an electrical conductor of a primary conductor pattern pair, said conductor being implemented as a hollow conductor.

FIG. 8 illustrates a first embodiment of an arrangement of an electrical conductor 86, 88, implemented as a hollow conductor 80, of a primary conductor pattern pair 31, 32, e.g. the first electrical conductor 86 of the first primary conductor pattern pair 31. The view shown in FIG. 8 can represent a cross-section in a radial direction r perpendicular to the longitudinal axis z of four adjacent turns. The four adjacent turns can be associated with two serially interconnected sections 41*a*, 41*b*, wherein the electrical conductor 86 is disposed such that the two adjacent turns run pairwise in each case, and a turn is spaced farther apart from a first adjacent turn than from a second adjacent turn in each case. The two sections 41*a*, 41*b* are cooled by means of different cooling circuits 71*a*, 71*b*: the first section 41*a* encloses a first coolant 81*a* of a first cooling circuit 71*a*. The second section 41*b* encloses a second coolant 81*b* of a second cooling circuit 71*b*.

Figure 9:
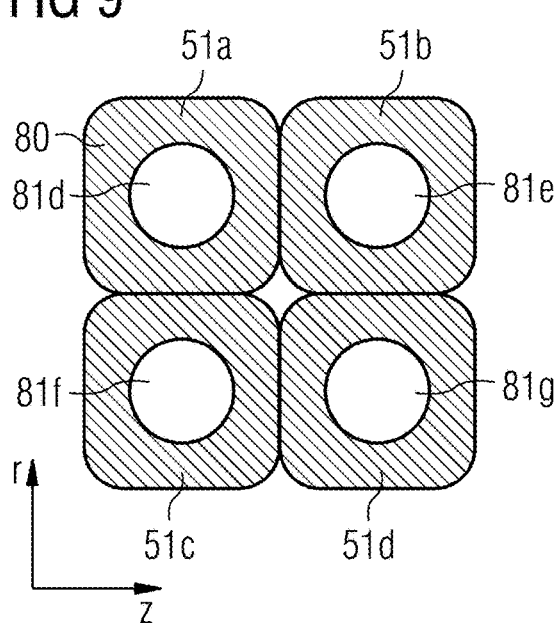
FIG. 9 illustrates a second embodiment of an example arrangement of an electrical conductor of a primary conductor pattern pair, said conductor being implemented as a hollow conductor or a helical conductor pattern.

FIG. 9 illustrates a second embodiment of an arrangement of an additional electrical conductor 91, 92 of a helical conductor pattern 51, 52 implemented as a hollow conductor 80, e.g. the first additional electrical conductor 91 of the first helical conductor pattern 51. The view shown in FIG. 9 can represent a cross-section in radial direction r parallel to the longitudinal axis z of four adjacent turns. In the embodiment shown, the additional electrical conductor 91 of the helical conductor pattern 51 can be subdivided into four serially interconnected additional sections 51*a*, 51*b*, 51*c*, 51*d*. The additional electrical conductor 91 is arranged helically in additional turns such that four adjacent additional turns of the additional electrical conductor 91 can be assigned to the four mutually different additional sections 51*a*, 51*b*, 51*c*, 51*d*. As in the case shown, two of the four additional sections 51*a*, 51*b*, 51*c*, 51*d* can be adjacent in the radial direction r and two of the four additional sections 51*a*, 51*b*, 51*c*, 51*d* can be adjacent in the longitudinal direction z in each case. The four additional sections 51*a*, 51*b*, 51*c*, 51*d* may be cooled by means of different additional cooling circuits: the first additional section 51*a* encloses a fourth coolant 81*d* of a fourth cooling circuit 71*d*. The second additional section 51*b* encloses a fifth coolant 81*e* of a fifth cooling circuit 71*e*. The third additional section 51*c* encloses a sixth coolant 81*f* of a sixth cooling circuit 71*f*. The fourth additional section 51*d* encloses a seventh coolant 81*g* of a seventh cooling circuit 71*g*.

The electrical conductor 86, 88 can be implemented analogously to the additional electrical conductor 91 shown in FIG. 8, e.g. also in the representation of a cross-section of four adjacent turns in a radial direction r perpendicular to the longitudinal axis z.

Figure 10:
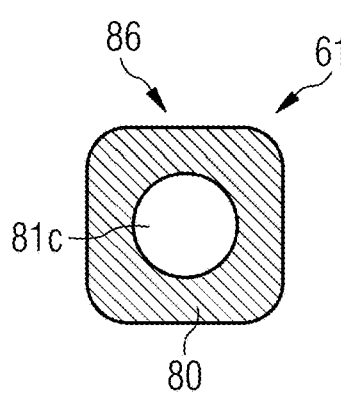
FIG. 10 illustrates a first embodiment of an example electrical conductor of a secondary conductor pattern pair, said conductor bring implemented as a hollow conductor.

FIG. 10 illustrates a first embodiment of an electrical conductor 86, implemented as a hollow conductor 80, of a secondary conductor pattern pair 61, which hollow conductor 80 encloses a third coolant 81*c* of a third cooling circuit 71*c*, in a view representing a cross-section, e.g. the cross-sectional area of the electrical conductor 86.

Figure 11:
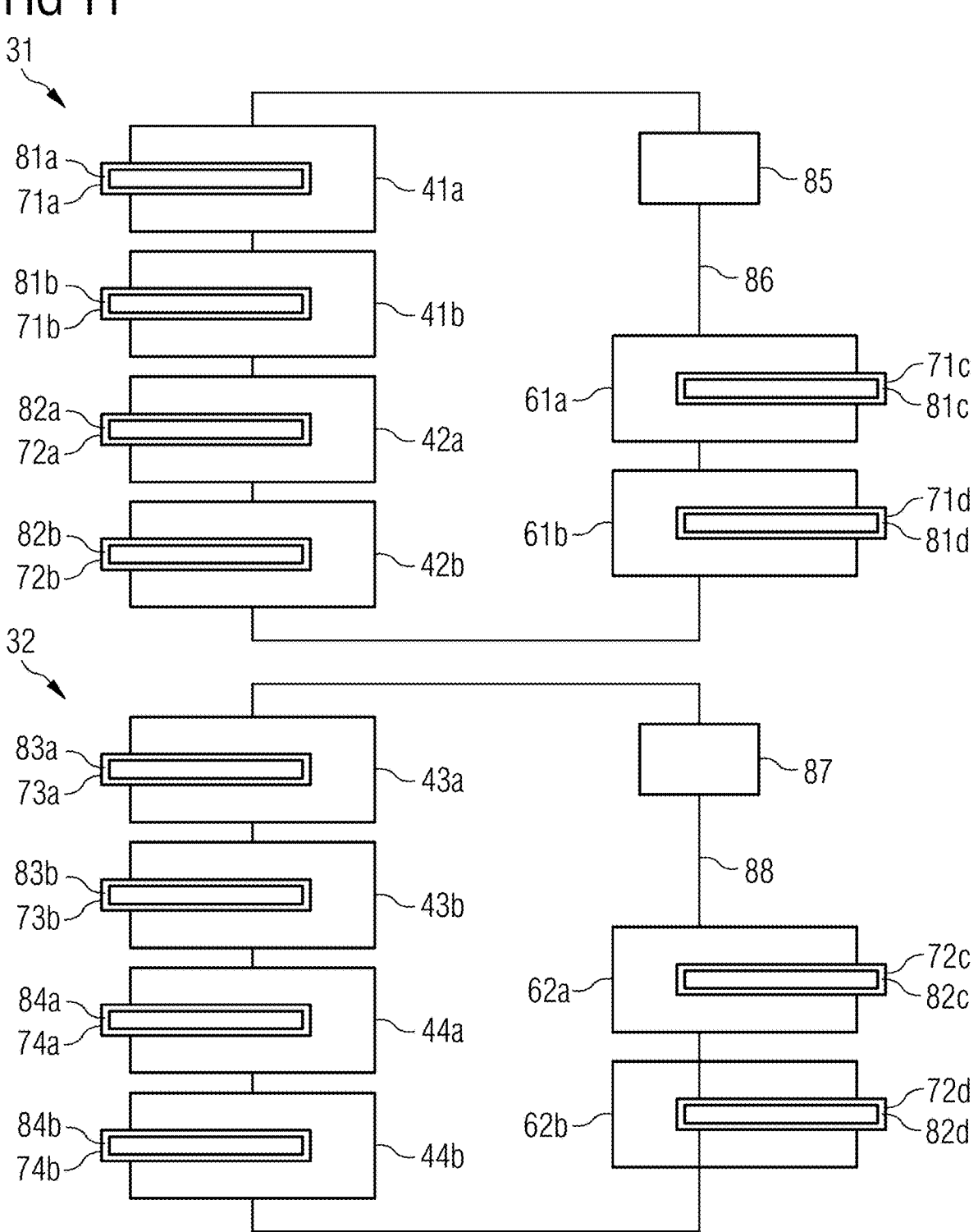
FIG. 11 illustrates an example gradient system according to the disclosure.

FIG. 11 illustrates a gradient system according to the disclosure. The gradient system comprises a gradient coil unit 19 according to the disclosure and at least two gradient amplifier units 85, 87, wherein one of the two gradient amplifier units 85, 87 is connected to one of the two primary conductor pattern pairs 31, 32 in each case. The gradient coil unit 19 comprises two primary conductor pattern pairs 31, 32 implemented as part of a primary coil 30 for generating a magnetic field gradient in a first spatial direction. The illustrated embodiment of the gradient coil unit 19 comprises two secondary conductor pattern pairs 61, 62 implemented as part of a secondary coil 60 for shielding the magnetic field gradient generated by the primary coil 30 in a periphery of the gradient coil unit 19. A first primary conductor pattern pair 31 of the two primary conductor pattern pairs 31, 32, a first secondary conductor pattern pair 61 of the two secondary conductor pattern pairs 61, 62 comprising two secondary spiral conductor patterns 61*a*, 61*b*, and a first gradient amplifier unit 85 of the two gradient amplifier units 85, 87 are connected in series with a first electrical conductor 86 of the at least two electrical conductors 86, 88. A second primary conductor pattern pair 32 of the two primary conductor pattern pairs 31, 32, a second secondary conductor pattern pair 62 of the two secondary conductor pattern pairs 61, 62 comprising two secondary spiral conductor patterns 62*a*, 62*b*, and a second gradient amplifier unit 87 of the two gradient amplifier units 85, 87 are connected in series with a second electrical conductor 86 of the at least two electrical conductors 86, 88.

The primary conductor pattern pairs 31, 32 comprise serially interconnected sections 41*a*, 41*b*, 42*a*, 42*b*, 43*a*, 43*b*, 44*a*, 44*b*, which can be cooled in each case by a first or second cooling circuit 71*a*, 71*b*, 72*a*, 72*b*, 73*a*, 73*b*, 74*a*, 74*b* comprising a first or second coolant 81*a*, 81*b*, 82*a*, 82*b*, 83*a*, 83*b*, 84*a*, 84*b*. Two secondary spiral conductor patterns 61*a*, 62*a* of the secondary spiral conductor patterns 61*a*, 61*b*, 62*a*, 62*b* are cooled in each case by separate third cooling circuits 71*c*, 72*c* comprising a third coolant 81*c*, 82*c*. Two secondary spiral conductor patterns 61*b*, 62*b* of the secondary spiral conductor patterns 61*a*, 61*b*, 62*a*, 62*b* are cooled in each case by separate eighth cooling circuits 71*d*, 72*d* comprising an eighth coolant 81*d*, 82*d*. According to this embodiment, the gradient system comprises at least the first cooling circuits 71*a*, 72*a*, 73*a*, 74*a*, second cooling circuits 71*b*, 72*b*, 73*b*, 74*b*, third cooling circuits 71*c*, 72*c*, and eighth cooling circuits 71*d*, 72*d*.

The gradient system may also comprise the additional primary coil 50 and the additional gradient amplifier units 89, 90 required to drive additional electrical conductors 91, 92 not shown in detail in this FIG. 11. The gradient system can comprise an additional primary coil designed to generate a magnetic field gradient in a third spatial direction. The additional primary coil is typically driven by two additional gradient amplifier units which are incorporated in the gradient system and is of similar design to the primary coil 30.

Figure 12:
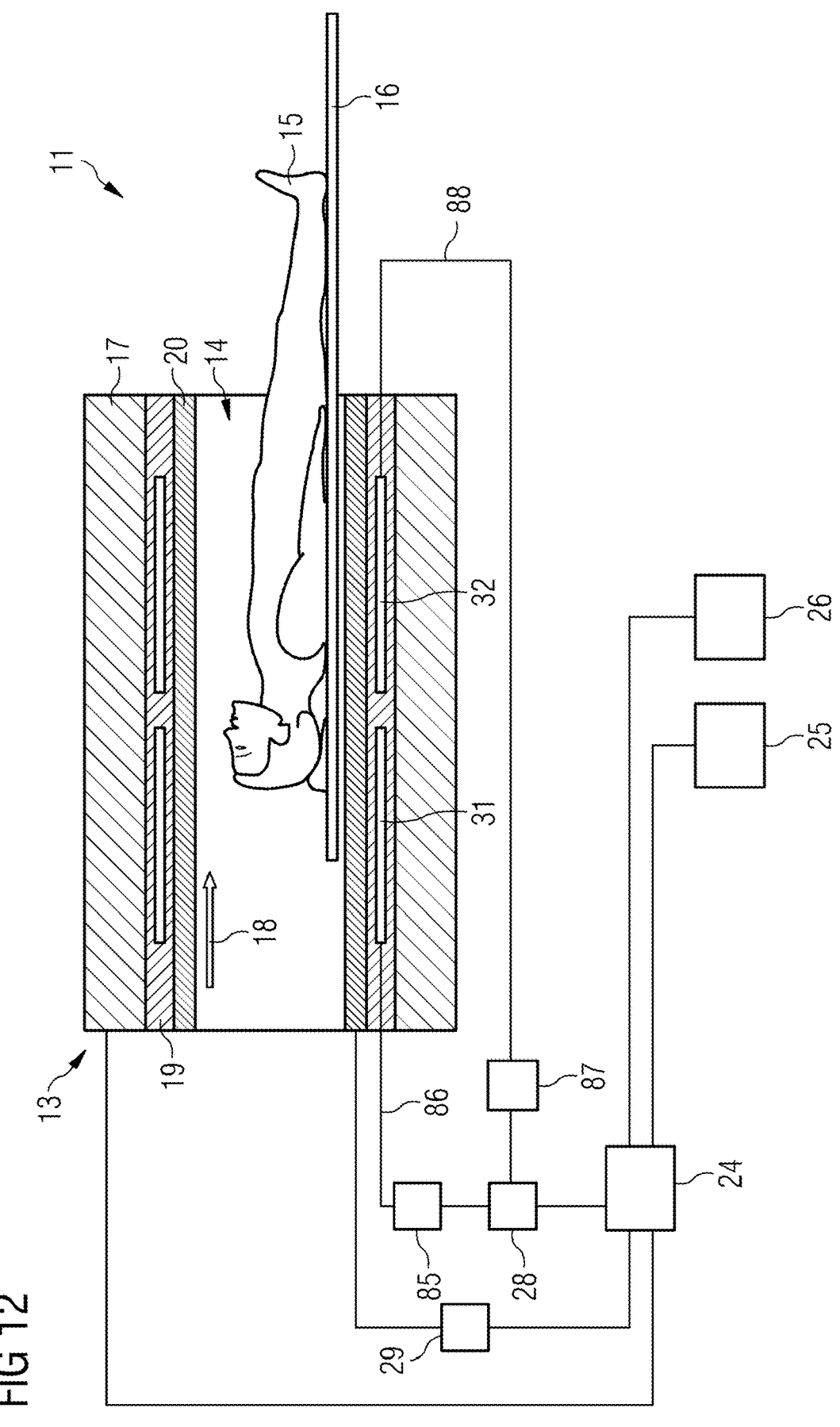
FIG. 12 illustrates an example magnetic resonance device according to the disclosure.

FIG. 12 illustrates a magnetic resonance device 11 according to the disclosure. The magnetic resonance device 11 comprises a detector unit 13 having a main magnet 17 for generating a powerful and constant main magnetic field 18 parallel to the longitudinal direction. The magnetic resonance apparatus 11 additionally comprises a cylindrical patient tunnel 14 for accommodating a patient 15, wherein the patient tunnel 14 is cylindrically enclosed by the detector unit 13 in a circumferential direction. The patient 15 can be moved into the patient tunnel 14 by means of a patient positioning device 16 of the magnetic resonance apparatus 11. For this purpose, the patient positioning device 16 comprises a patient table which is movably disposed within the magnetic resonance apparatus 11. The detector unit 13 also comprises a radiofrequency antenna unit 20 (also referred to herein as RF circuitry or RF antenna circuitry) which in the case shown is implemented as a body coil fixedly incorporated in the magnetic resonance apparatus 11, and a radiofrequency antenna control unit 29 (also referred to herein as RF control circuitry or RF antenna control circuitry) for exciting a polarization arising in the main magnetic field 18 generated by the main magnet 17. The radiofrequency antenna unit 20 is controlled by the radiofrequency antenna control unit 29, and irradiates RF pulses into an examination space essentially formed by the patient tunnel 14.

The detector unit 13 also comprises a gradient coil unit 19 (also referred to herein as gradient coil circuitry) according to the disclosure, which is used for spatial encoding during imaging. The gradient coil unit 19 comprises a hollow cylindrical primary coil 30 surrounding the cylindrical patient tunnel 14 in the longitudinal direction, which is configured to generate a magnetic field gradient in a first spatial direction. The primary coil 30 comprises two primary conductor pattern pairs 31, 32, wherein each primary conductor pattern pair of the two primary conductor pattern pairs 31, 32 spans two quadrants of the primary coil 30. The magnetic resonance device 11 additionally comprises two gradient amplifier units 85, 87 (also referred to herein as gradient amplifiers or gradient amplifier circuitry). A first gradient amplifier unit 85 of the two gradient amplifier units 85, 87 is connected to a first primary conductor pattern pair 31 of the two primary conductor pattern pairs 31, 32, e.g. by means of a first electrical conductor 86, which can also be at least partially comprised by the first primary conductor pattern pair 31. The first gradient amplifier unit 85 is configured to individually drive the first primary conductor pattern pair 31. A second gradient amplifier unit 87 of the two gradient amplifier units 85, 87 is connected to a second primary conductor pattern pair 32 of the two primary conductor pattern pairs 31, 32, e.g. by means of a second electrical conductor 88, which can also be at least partially comprised by the second primary conductor pattern pair 32. The second gradient amplifier unit 87 is configured to individually drive the second primary conductor pattern pair 32. The gradient coil unit 19, e.g. the two gradient amplifier units 85, 87, are controlled by means of a gradient control unit 28 for generating a magnetic field gradient in the first spatial direction. The gradient control unit 28 is typically configured to control all the gradient amplifier units 85, 87 and additional gradient amplifier units 89, 90 (also referred to herein as gradient amplifiers or gradient amplifier circuitry) contained in the gradient system. For this purpose, the gradient control unit 28 is typically connected to the gradient amplifier units 85, 87 and additional gradient amplifier units 89, 90, and these are designed to generate, in the gradient coil unit 19, an electric voltage and/or an electric current, e.g. gradient pulses in accordance with an MR control sequence, as specified e.g. by the gradient control unit 28. For a detailed illustration of the gradient coil unit 19 and/or the primary coil 30, reference is made in particular to FIGS. 1 to 9.

The magnetic resonance apparatus 11 has a control unit 24 (also referred to herein as a controller or control computer) for controlling the main magnet 17, the gradient control unit 28, and the radiofrequency antenna control unit 29. The control unit 24 centrally controls the magnetic resonance device 11, e.g. the execution of MR control sequences. The magnetic resonance device 11 has a display unit 25 (also referred to herein as a display). In addition, the magnetic resonance device 11 has an input unit 26 (also referred to herein as a user interface) by means of which information and/or control parameters can be entered by a user during a measurement process. The control unit 24 can comprise the gradient control unit 28 and/or RF antenna control unit 29 and/or the display unit 25 and/or the input unit 26.

The magnetic resonance device 11 shown can self-evidently comprise other components usually found in magnetic resonance devices 11. As the general mode of operation of a magnetic resonance apparatus 11 will also be well-known to persons skilled in the art, the additional components are not therefore described in detail.

Although the disclosure has been illustrated and described in detail by the preferred exemplary embodiments, the disclosure is not limited by the examples disclosed and other variations will be apparent to persons skilled in the art without departing from the scope of protection sought for the disclosure.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. Gradient coil circuitry, comprising:
    a hollow cylindrical primary coil longitudinally surrounding a cylinder axis and configured to generate a magnetic field gradient in a first spatial direction,
    wherein the hollow cylindrical primary coil comprises:
    two primary conductor pattern pairs, each one of the two primary conductor pattern pairs being driven separately and spanning one half of the hollow cylindrical primary coil; and two spiral conductor patterns that are formed by an electrical conductor configured as a hollow conductor, and wherein a portion of the electrical conductor of one of the two primary conductor pattern pairs corresponds to a spiral conductor pattern of the two spiral conductor patterns that is (i) subdivided into two serially interconnected sections, and (ii) arranged spirally in turns such that two adjacent turns of the electrical conductor correspond to two mutually different sections.

2. The gradient coil circuitry as claimed in claim 1, wherein the portion of the electrical conductor is arranged such that the two adjacent turns run in pairs.

3. The gradient coil circuitry as claimed in claim 1, wherein the two adjacent turns of the electrical conductor comprise an outer turn and an inner turn, and wherein the portion of the electrical conductor is arranged such that the outer turn of the two adjacent turns is at a smaller distance from an adjacent inner turn than an adjacent outer turn.

4. The gradient coil circuitry as claimed in claim 1, further comprising:

a first cooling circuit comprising a first coolant;

a second cooling circuit comprising a second coolant, wherein the electrical conductor in a first section of the two serially interconnected sections encloses the first coolant as a hollow conductor, and wherein the electrical conductor in a second section of the two serially interconnected sections encloses the second coolant as a hollow conductor.

5. The gradient coil circuitry of claim 4, wherein the portion of the electrical conductor is arranged such that the two adjacent turns run in pairs.

6. The gradient coil circuitry as claimed in claim 1, wherein the electrical conductor is arranged spirally in turns such that each of the two spiral conductor patterns comprises at least 35 turns.

7. The gradient coil circuitry as claimed in claim 1, wherein the electrical conductor has a cross-sectional area of less than 35 mm².

8. The gradient coil circuitry of claim 7, wherein the electrical conductor is configured to conduct an electric current with a strength between 800 amps and 1500 amps, and wherein the hollow conductor comprises a hollow region configured to hold a coolant, the hollow region having a cross-sectional area between 9 mm² and 16 mm².

9. The gradient coil circuitry as claimed in claim 1, wherein each of the two spiral conductor patterns is configured to at least partially surround two predetermined points in a spiral manner.

10. The gradient coil circuitry as claimed in claim 1, wherein the two primary conductor pattern pairs are separated from one other by a plane that is perpendicular to the cylinder axis.

11. The gradient coil circuitry as claimed in claim 1, further comprising:

a further hollow cylindrical primary coil configured to generate a magnetic field gradient in a second spatial direction corresponding to a longitudinal direction that aligns with the cylinder axis, wherein the further hollow cylindrical primary coil comprises two helical conductor patterns surrounding the cylinder axis, wherein the two helical conductor patterns are spatially separated from each other by a plane perpendicular to the cylinder axis and are separately drivable, and wherein each of the two helical conductor patterns comprises a further electrical conductor in the form of a hollow conductor.

12. The gradient coil circuitry as claimed in claim 11, wherein the further electrical conductor of one of the two helical conductor patterns is subdivided into two serially interconnected sections, and wherein the further electrical conductor is arranged helically in further turns such that two adjacent further turns of the further electrical conductor correspond to two mutually different sections.

13. The gradient coil circuitry as claimed in claim 12, further comprising:

a first cooling circuit having a first coolant; and a second cooling circuit having a second coolant, wherein the electrical conductor in a first further section of the two serially interconnected sections encloses the first coolant as a hollow conductor, and wherein the electrical conductor in a second additional section of the two serially interconnected sections encloses the second coolant as a hollow conductor.

14. The gradient coil circuitry as claimed in claim 1, further comprising:

a secondary coil configured to shield the magnetic field gradient generated by the hollow cylindrical primary coil in a periphery of the gradient coil circuitry, the secondary coil comprising two secondary conductor pattern pairs, wherein one of the two secondary conductor pattern pairs (i) is disposed in the same half as one of the two primary conductor pattern pairs and is coupled in series with the one of the two primary conductor pattern pairs, and (ii) comprises an electrical conductor that is arranged at least partially in a spiral manner.

15. The gradient coil circuitry as claimed in claim 14, further comprising:

a cooling circuit comprising a coolant, wherein the electrical conductor comprised by one of the two secondary conductor pattern pairs comprises a hollow conductor and encloses the coolant.

16. The gradient coil circuitry of claim 1, further comprising:

a secondary coil configured to shield the magnetic field gradient, the secondary coil comprising at least one secondary conductor pattern pair, wherein the at least one secondary conductor pattern pair has less than 60% of the turns of one of the two primary conductor pattern pairs.

17. The gradient coil circuitry of claim 1, wherein the hollow cylindrical primary coil is configured to generate a magnetic field gradient with (i) a gradient amplitude of at least 180 mT/m, and (ii) a slew rate of at least 180 mT/m/ms.

18. The gradient coil circuitry of claim 1, further comprising:

a cooling circuit configured to pass coolant sequentially through the first section and the second section of the two serially interconnected sections, wherein the arrangement of the two adjacent turns corresponding to two mutually different sections provides a more uniform cooling distribution across the spiral conductor pattern compared to a sequential arrangement of turns along a single coolant flow path.

19. A gradient system, comprising:

a hollow cylindrical primary coil longitudinally surrounding a cylinder axis and configured to generate a magnetic field gradient in a spatial direction, the hollow cylindrical primary coil comprising:

two primary conductor pattern pairs, each one of the two primary conductor pattern pairs being driven separately and spanning one half of the hollow cylindrical primary coil; and two spiral conductor patterns that are formed by an electrical conductor configured as a hollow conductor;

a first gradient amplifier; and a second gradient amplifier, wherein the first gradient amplifier is coupled to a first one of the two primary conductor pattern pairs, wherein the second gradient amplifier is coupled to a second one of the two primary conductor pattern pairs, and wherein a portion of the electrical conductor of one of the two primary conductor pattern pairs corresponds to a spiral conductor pattern of the two spiral conductor patterns that is (i) subdivided into two serially interconnected sections, and (ii) arranged spirally in turns such that two adjacent turns of the electrical conductor correspond to two mutually different sections.

20. A magnetic resonance apparatus, comprising:

a main magnet;

radio frequency (RF) antenna circuitry;

gradient coil circuitry, comprising a hollow cylindrical primary coil longitudinally surrounding a cylinder axis and configured to generate a magnetic field gradient in a spatial direction, the hollow cylindrical primary coil comprising (i) two primary conductor pattern pairs, each one of the two primary conductor pattern pairs being driven separately and spanning one half of the hollow cylindrical primary coil, and (ii) two spiral conductor patterns that are formed by an electrical conductor configured as a hollow conductor; and a gradient controller coupled to the gradient coil circuitry and configured to control the gradient coil circuitry to generate a magnetic field gradient in the spatial direction, wherein a portion of the electrical conductor of one of the two primary conductor pattern pairs corresponds to a spiral conductor pattern of the two spiral conductor patterns that is (i) subdivided into two serially interconnected sections, and (ii) arranged spirally in turns such that two adjacent turns of the electrical conductor correspond to two mutually different sections.

\* \* \* \* \*